US009480193B2

(12) United States Patent
Vermeir et al.

(10) Patent No.: US 9,480,193 B2
(45) Date of Patent: Oct. 25, 2016

(54) LOAD DETECTION CIRCUIT AND METHOD

(71) Applicant: SEMICONDUCTOR COMPONENTS INDUSTRIES, LLC, Phoenix, AZ (US)

(72) Inventors: Sam Vermeir, Hofstade (BE); Leo Aichriedler, Ebersberg (DE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 177 days.

(21) Appl. No.: 14/542,778

(22) Filed: Nov. 17, 2014

(65) Prior Publication Data

US 2015/0145562 A1 May 28, 2015

Related U.S. Application Data

(60) Provisional application No. 61/908,123, filed on Nov. 24, 2013.

(51) Int. Cl.
*H05K 13/00* (2006.01)
*H05B 33/08* (2006.01)
*G01R 31/02* (2006.01)
*G01R 31/26* (2014.01)

(52) U.S. Cl.
CPC .......... *H05K 13/00* (2013.01); *H05B 33/0887* (2013.01); *G01R 31/026* (2013.01); *G01R 31/2621* (2013.01); *Y10T 29/49117* (2015.01); *Y10T 29/49169* (2015.01)

(58) Field of Classification Search
CPC .............. H05K 13/00; H05B 33/0887; Y10T 29/49117; Y10T 29/49169; G01R 31/026; G01R 31/2621
USPC ........................................................ 327/108
See application file for complete search history.

(56) References Cited

U.S. PATENT DOCUMENTS

| 5,438,286 A | 8/1995 | Pavlin et al. |
| 5,760,613 A | 6/1998 | Pulvirenti et al. |
| 7,667,940 B2 | 2/2010 | Turpin et al. |

*Primary Examiner* — Ryan Jager
(74) *Attorney, Agent, or Firm* — Robert F. Hightower

(57) ABSTRACT

In one embodiment, a load detection circuit may include a first circuit configured to control a first transistor to form a load current to a load in a first operating mode of the load detection circuit, a second circuit configured to be coupled to form at least a portion of the load current in a second operating mode of the load detection circuit, and a detection circuit configured to detect the control electrode of the first transistor having a value that is less than a threshold value of the first transistor.

20 Claims, 5 Drawing Sheets

US 9,480,193 B2

LOAD DETECTION CIRCUIT AND METHOD

PRIORITY CLAIM TO PRIOR PROVISIONAL FILING

This application claims priority to prior filed Provisional Application No. 61/908,123 entitled "LOAD DETECTION CIRCUIT AND METHOD" filed on Nov. 24, 2013, having a docket number of ONS01612, and having common inventors Vermeir et al. which is hereby incorporated herein by reference

BACKGROUND OF THE INVENTION

The present invention relates, in general, to electronics, and more particularly, to semiconductors, structures thereof, and methods of forming semiconductor devices.

In the past, the electronics industry utilized various methods and structures to form field effect transistors (FETs). The FETs were often used in various applications to control current. In some applications, such as in automobiles for example, FETs may have been used to control current through light sources, such as light emitting diodes (LEDs) or light bulbs, or have been used to control power distribution or to replace mechanical relays, or various other applications. The FETs often had some control circuitry to assist in operating the FETs and to determine when to enable and disable the FETs. A FET combined with control circuitry often was referred to as a SmartFET. The FETs may have been used in harsh electronic environments where both the load impedance as well as the power rail could be unpredictable and unstable.

Some control circuits may have also included protection and/or diagnostic circuits to assist in safely operating the FET under some normal and abnormal operating conditions that can occur in an application. In some applications, diagnostic circuits may have been embedded in the control circuit and/or were used to determine the state of the load. In some control circuits, the FET was disabled for a time in order to determine if the system was operating properly. Some other control circuits may have controlled the FET in an open loop control mode to determine if the system was operating properly. Some other control circuit may have copied a voltage across the FET to another device and then measured the copied load current. However, the difference between the minimum and maximum parameters of the circuit resulted in inaccurate assessment of the condition of the system.

Accordingly, it is desirable to have a device and method of testing a FET circuit for system errors such as an open circuit, or an under-load condition.

Figure 1:
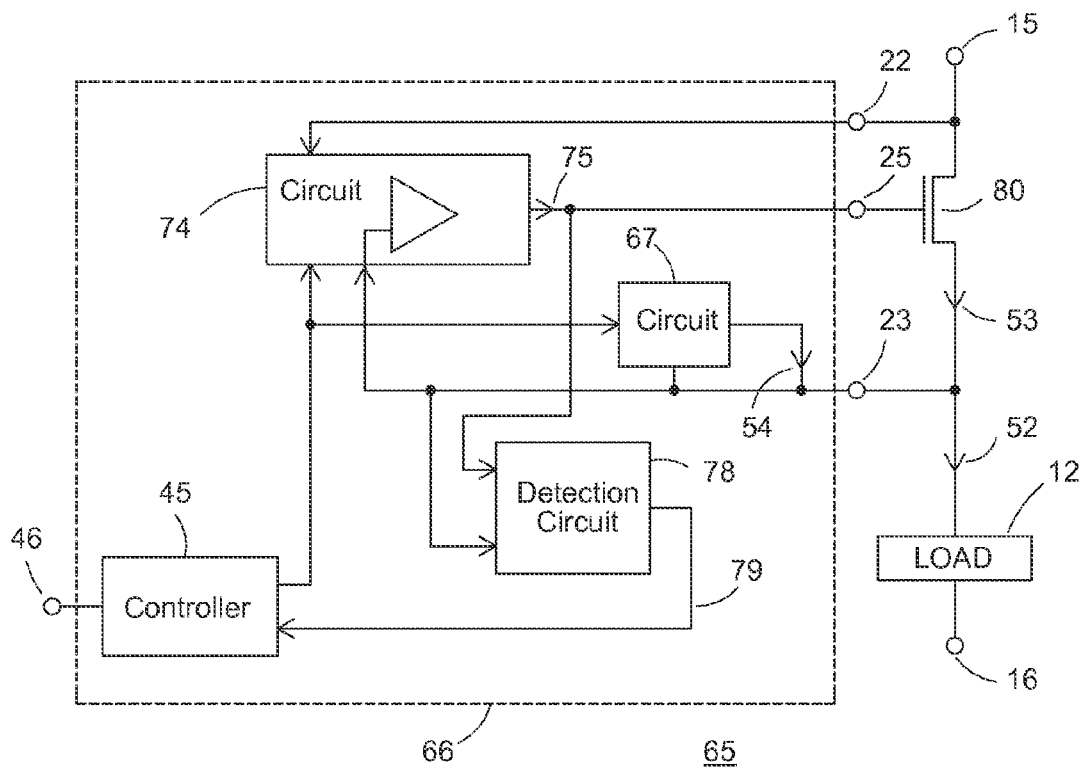
FIG. 1 schematically illustrates an example of an embodiment of a portion of a system that may be configured to detect the absence, or in some embodiments the presence, of a load in accordance with the present invention.

For simplicity and clarity of the illustration(s), elements in the figures are not necessarily to scale, some of the elements may be exaggerated for illustrative purposes, and the same reference numbers in different figures denote the same elements, unless stated otherwise. Additionally, descriptions and details of well-known steps and elements may be omitted for simplicity of the description. As used herein current carrying element or current carrying electrode means an element of a device that carries current through the device such as a source or a drain of a MOS transistor or an emitter or a collector of a bipolar transistor or a cathode or anode of a diode, and a control element or control electrode means an element of the device that controls current through the device such as a gate of a MOS transistor or a base of a bipolar transistor. Additionally, one current carrying element may carry current in one direction through a device, such as carry current entering the device, and a second current carrying element may carry current in an opposite direction through the device, such as carry current leaving the device. Although the devices may be explained herein as certain N-channel or P-channel devices, or certain N-type or P-type doped regions, a person of ordinary skill in the art will appreciate that complementary devices are also possible in accordance with the present invention. One of ordinary skill in the art understands that the conductivity type refers to the mechanism through which conduction occurs such as through conduction of holes or electrons, therefore, that conductivity type does not refer to the doping concentration but the doping type, such as P-type or N-type. It will be appreciated by those skilled in the art that the words during, while, and when as used herein relating to circuit operation are not exact terms that mean an action takes place instantly upon an initiating action but that there may be some small but reasonable delay(s), such as various propagation delays, between the reaction that is initiated by the initial action. Additionally, the term while means that a certain action occurs at least within some portion of a duration of the initiating action. The use of the word approximately or substantially means that a value of an element has a parameter that is expected to be close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. When used in reference to a state of a signal, the term "asserted" means an active state of the signal and the term "negated" means an inactive state of the signal. The actual voltage value or logic state (such as a "1" or a "0") of the signal depends on whether positive or negative logic is used. Thus, asserted can be either a high voltage or a high logic or a low voltage or low logic depending on whether positive or negative logic is used and negated may be either a low voltage or low state or a high voltage or high logic depending on whether positive or negative logic is used. Herein, a positive logic convention is used, but those skilled in the art understand that a negative logic convention could also be used. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. Reference to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but in some cases it may. Furthermore, the particular features, structures or characteristics may be combined in any suitable manner, as would be apparent to one of ordinary skill in the art, in one or more embodiments. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

FIG. 1 schematically illustrates an example of an embodiment of a portion of a system 65 that may be configured to detect the absence, or in some embodiments the presence, of a load 12. System 65 includes a first transistor, such as for example a transistor 80, that is configured to form a current 53 that may become a load current 52 for load 12. System 65 also includes a load detection circuit 66 that is configured to be coupled to transistor 80 and control transistor 80 to provide load current 52 to load 12.

An embodiment of circuit 66 may include a first circuit or driver circuit 74 that may be configured to control first transistor 80 to form load current 52 for load 12 in a first operating mode of load detection circuit 66. An embodiment of circuit 66 may also include a second circuit, such as for example a diagnostic circuit 67, that may be configured to selectively form at least a portion of current 52 in a second operating mode of circuit 66. An embodiment may include that circuit 67 is configured to not supply the portion of current 52 in the first operating mode of circuit 66.

In an embodiment, circuit 66 may include that first circuit 74 is configured to control first transistor 80 in a closed loop configuration in the second operating mode. In an embodiment, first circuit 74 may be configured to control first transistor 80 to form a voltage drop across transistor 80 in the second operating mode. An embodiment may also include that first circuit 74 may control first transistor 80 in a closed loop configuration in the first operating mode. In other embodiments, first circuit 74 may control first transistor 80 in an open loop configuration in the first operating mode. An embodiment may also include a detection circuit 78 configured to detect the absence of load 12. An embodiment of circuit 78 may be configured to detect that load current 52 is less than a threshold value of current 52. The threshold value of current 52 is a value that is less than a desired minimum value of current 52 that is used for load 12 but may correspond to a value of leakage current of current 52. An embodiment of circuit 66 may include that detection circuit 78 may be configured to detect that the control electrode of first transistor 80 has a value that is less than a threshold value of first transistor 80.

In an embodiment, the second circuit may be configured to include a selectable current source configured to selectively form current 54 as at least a portion of load current 52 in response to the second operating mode of the load detection circuit but not in the first operating mode.

An embodiment of a method of forming circuit 66 may include configuring a current source to form a current, and configuring load detection circuit 66 to operate in a first mode and selectively disable the current source and selectively apply a first control signal, such as signal 75 for example, having a first value to a first transistor, such as for example transistor 80, to control the first transistor to form a first load current to load 12. An embodiment of the method may also include configuring load detection circuit 66 to operate in a second mode and selectively enable the current source to form at least a portion 54 of load current 52 to load 12 and to selectively apply a second value of control signal 75 to first transistor 80 to control the first transistor and form a first voltage across first transistor 80 wherein the first voltage is no less than the second value. An embodiment of the method may also include configuring detection circuit 78 to detect second control signal 75 having the second value that is substantially less than a threshold voltage of the first transistor.

Figure 2:
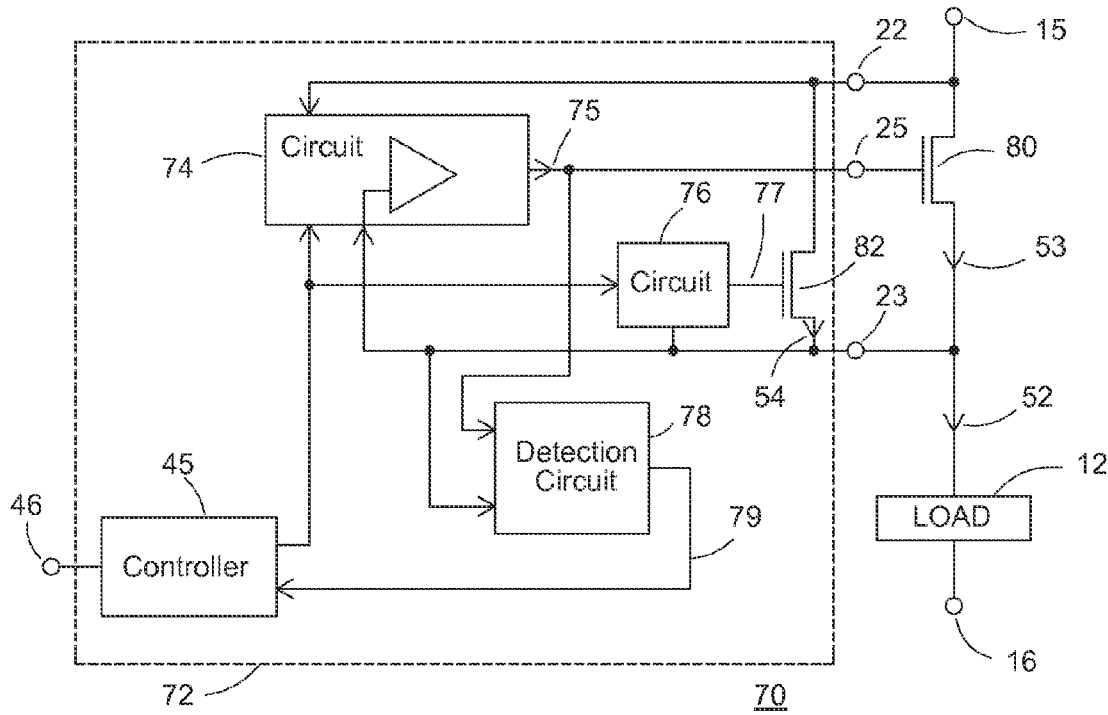
FIG. 2 schematically illustrates an example of an embodiment of a portion of a system that is an alternate embodiment of the system of FIG. 1 in accordance with the present invention.

FIG. 2 schematically illustrates an example of an embodiment of a portion of a system 70 that includes a load detection circuit 72 that is an alternate embodiment of circuit 66 that was explained in the description of FIG. 1. Circuit 72 may be the same as circuit 66 except that circuit 72 includes a second circuit or a diagnostic circuit 76 and a second transistor, such as for example transistor 82, that are an alternate embodiment of circuit 67 of FIG. 1. Circuit 76 and transistor 82 may operate substantially the same as circuit 67.

An embodiment of circuit 72 may include that transistor 82 may be configured to be coupled in parallel to first transistor 80. In an embodiment, second transistor 82 may have a control electrode that is not coupled to a control electrode of first transistor 80. An embodiment of circuit 72 may also include that circuit 76 may be configured to control second transistor 82 to form current 54 as at least a portion of load current 52 in the second operating mode of load detection circuit 72 but to not supply current 54 in the first operating mode of circuit 72.

An embodiment of a method of forming circuit 72 may include configuring a first transistor, such as for example transistor 82, for coupling in parallel to a second transistor, such as for example transistor 80. An embodiment of the method may also include configuring load detection circuit 72 to operate in a first mode and selectively disable the first transistor and selectively apply a first control signal having a first value to the second transistor to control the second transistor to form load current 52. In an embodiment, the method may also include configuring load detection circuit 72 to operate in a second mode and selectively enable the first transistor, such as for example transistor 82, to form at least a portion 54 of load current 52 to load 12 and to selectively apply a second control signal 75 having a second value to the second transistor to control the second transistor and form a first voltage across the second transistor wherein the first voltage is no less than the second value. An embodiment of the method may also include configuring detection circuit 78 to detect second control signal 75 having the second value that is substantially less than a threshold voltage of the second transistor.

Figure 3:
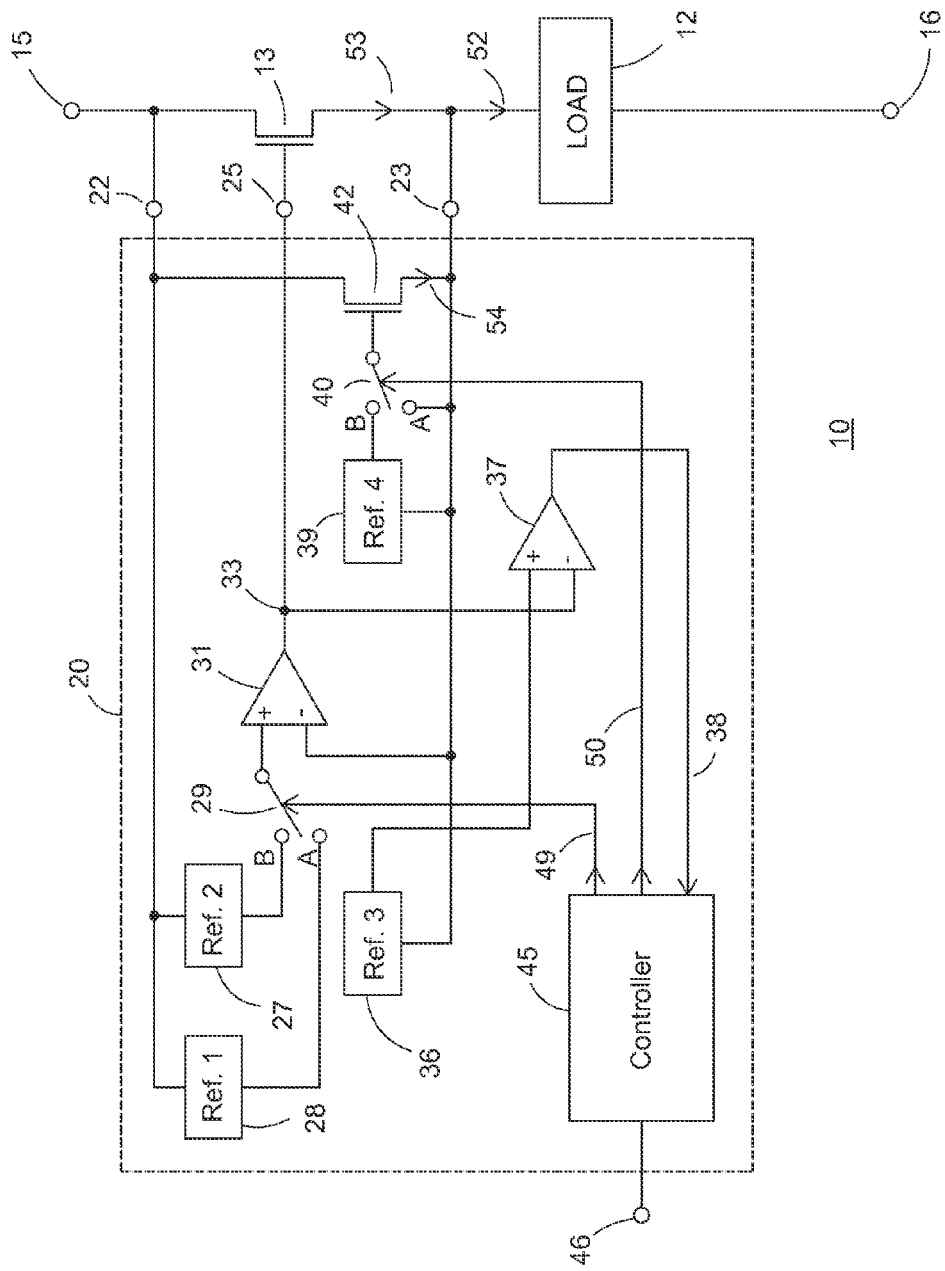
FIG. 3 schematically illustrates an example of an embodiment of a portion of a system that is an alternate embodiment of the system of FIG. 1 and/or FIG. 2 in accordance with the present invention.

FIG. 3 schematically illustrates an example of an embodiment of a portion of a system 10 that is an alternate embodiment of systems 66 and 70 that were described in the descriptions of respective FIG. 1 and FIG. 2. System 10 includes a driver transistor 13 that is an alternate embodiment of transistor 80 that was described in the description of FIG. 1 and FIG. 2. Transistor 13 is similar to and operates similarly to transistor 80. In an embodiment, transistor 13 may be configured as a high side driver that receives power from a power supply connected between a supply terminal 15 and a common return terminal 16.

System 10 also includes a load detection circuit 20 that is an alternate embodiment of circuits 66 and 72 (FIGS. 1 and 2) and that operates substantially similar to circuits 66 and 72. Circuit 20 is configured to operate in a first operating mode to form a drive signal to control transistor 13 to supply load current 52 to load 12. An embodiment may also include that circuit 20 is configured to operate in a second operating mode or diagnostic operating mode which includes detecting the absence of load 12 while transistor 13 is enabled. An embodiment may include that circuit 20 can detect the absence of load 12 even if there is leakage current flowing such as leakage current related to load 12. For example, the absence of load 12 may include that load 12 may be turned-off and the leakage current may be current from circuits within load 12 that may be in a sleep mode or stand-by mode, or the leakage current may be leakage from parasitic resistances of cables or wiring harnesses that connect load 12 to transistor 13, or load 12 may be physically removed and the leakage current may be leakage from parasitic resistances of cables or wiring harnesses that connect load 12 to transistor 13.

In an embodiment, circuit 20 may include a first input terminal 22 that is connected to one current carrying electrode of transistor 13 and a second input terminal 23 that is connected to a second current carrying electrode of transistor 13. In an embodiment, transistor 13 may be an N-channel MOS transistor with the source connected to terminal 23 and a drain connected to terminal 22. A drive terminal 25 of circuit 20 may be configured to be connected to the gate of transistor 13 in order to control the operation of transistor 13. Circuit 20 also includes a driver circuit 31 that is configured to form a drive signal 33 to control transistor 13. An embodiment of circuit 20 may also include a first reference generator or reference circuit or Ref1 28 and a second reference generator or reference circuit or reference or Ref2 27 that in some embodiments may assist in controlling transistor 13. A switch 29 may be used to switch an input of circuit 31 between Ref1 28 and Ref2 27. In one embodiment, circuit 31 may be an operation amplifier. Circuit 20 may also include a diagnostic transistor 42 having current carrying electrodes coupled in parallel with the current carrying electrodes of transistor 13. In an embodiment, transistor 42 may be utilized in the diagnostic mode or second operating mode to assist in detecting the absence of load 12. In an embodiment, circuit 20 may also include a comparator 37 that may be utilized to assist in detecting the absence of load 12. Circuit 20 may also include a third reference generator or reference circuit or reference or Ref3 36 and a fourth reference generator or reference circuit or reference or Ref4 39. Circuit 20 also may include a controller circuit or controller 45 that may assist in operating circuit 20 in the first operating mode and in the second operating mode. An embodiment of controller 45 may include that controller 45 forms a first mode control signal 49 and a second mode control signal 50 that may assist in the operation of controller 20. In an embodiment, signal 50 may be omitted and signal 49 may be used to control the operation of both of switches 29 and 40. An embodiment may include that controller 45 may receive a signal 46 from external to circuit 20 to assist in operating controller 45. Controller 45 may have various different implementations including a microprocessor circuit or combinational digital logic or other such implementations.

Figure 4:
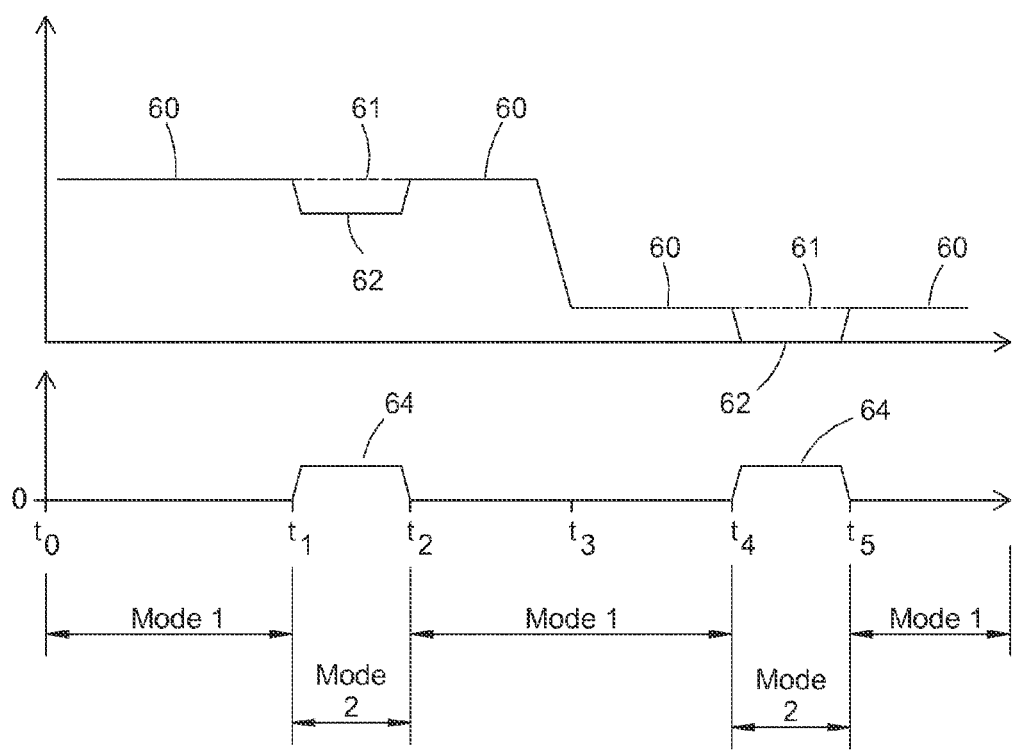
FIG. 4 is a graph having plots that illustrate in a general manner some signals that may be formed by the circuit of FIG. 3 in accordance with the present invention.

FIG. 4 is a graph having plots that illustrate in a general manner some signals that may be formed by circuit 20. The abscissa indicates time and the ordinate indicates increasing value of the illustrated signals. A plot 60 illustrates load current 52. A plot 61 illustrates in dashed lines, the value of current 52 formed by current 53 plus current 54. A plot 62 illustrates current 53 in the second operating mode. A plot 64 illustrates current 54. This description has references to FIG. 3 and FIG. 4.

Assume that at a time t0 and between t0 and a time t1, circuit 20 is operating in the first operating mode. In the first operating mode, circuit 20 is configured to operate transistor 13 in a closed loop configuration to form current 53 that becomes load current 52. An embodiment of circuit 31 is configured to receive signals that are representative of the voltage drop across transistor 13, such as for example the drain-source (Vds) voltage, and to regulate the voltage drop to no less than a first value. An embodiment may include that circuit 31 receives a first signal that is representative of the voltage on one current carrying electrode of transistor 13 and a second signal that is representative of the voltage on the voltage on the second current carrying electrode minus an offset voltage having the first value. For example, an inverting input of circuit 31 may receive the voltage on the source of transistor 13, and switch 29 may be activated to couple the non-inverting input of circuit 31 to receive a signal that is representative of the voltage on the drain of transistor 13 minus the value of the voltage from Ref1 28. A second switch 40 may be activated to couple the gate of transistor 42 to the source of transistor 42 in order to disable transistor 42. Thus, transistor 42 may be disabled in the first operating mode and current 54 is substantially zero. Circuit 31 forms drive signal 33 and controls transistor 13 to have a voltage drop across transistor 13 that is no less than the voltage from Ref1 28, and to also form current 53. Thus, in the first operating mode transistor 13 is enabled and the Vds of transistor 13 is no less than the value of the voltage from Ref1 28.

Comparator 37 is configured to detect the value of the gate-source voltage (Vgs) of transistor 13 having a value that is no greater than the threshold voltage (Vth) of transistor 13. Those skilled in the art will appreciate that the threshold voltage (Vth) is the minimum gate-to-source voltage required to enable transistor 13 to conduct a drain-to-source current. Comparator 37 receives a signal that is representative of the gate voltage of transistor 13 and another signal that is representative of the source voltage of transistor 13 minus an offset voltage from Ref3 36. In an embodiment, the value of the offset voltage from Ref3 36 is no greater than approximately the threshold voltage (Vth) of transistor 13. In some embodiments, the value of the offset voltage may be less than Vth. An embodiment may include that the offset voltage from Ref3 36 is approximately five to ten milli-volts (5-10 mv) less that Vth. Since transistor 13 is enabled to supply current 52, the Vgs is greater than Vth, thus detect signal 38 on the output of comparator 37 is negated. The negated state of comparator 37 indicates that load 12 is present.

In an embodiment, controller 45 may be configured to assert mode control signal 49, and optionally 50, to change switches 29 and 40 and operate circuit 20 in the second operating mode. Assume that at time t1 and between t1 and a time t2, controller 20 begins operating in the second operating mode, such as for example. In the second operating mode circuit 20 is configured to also operate transistor 13 in a closed loop configuration. Circuit 20 is also configured to operate transistor 42 in an open loop configuration to supply current 54 as illustrated by plot 64. Current 54 becomes a portion of load current 52. In some embodiments, it may be desirable to form transistor 42 to have a smaller size, such as a smaller active area, than the size of transistor 13, such as the active area size. Forming transistor 42 smaller than transistor 13 may assist in reducing the cost of circuit 20. Because transistor 42 may be smaller than transistor 13, it may be desirable to control transistor 13 to have a larger drain-source voltage (Vds) in the second operating mode to facilitate transistor 42 supplying a sufficiently large value of current 54 to ensure that transistor 42 is enabled. Thus, in the second operating mode, switch 29 may be switched to enable circuit 31 to receive a signal that is representative of the drain voltage of transistor 13 minus the offset voltage from Ref2 27. Consequently, in some embodiments the value of the voltage from Ref2 27 may be larger than the value of Ref1 28. Circuit 31 is configured to regulate the voltage drop across transistor 13 to no less than a second value of approximately Ref2 27 in the second operating mode.

If load 12 is present, currents 53 and 54 are summed together to form load current 52 as illustrated by plots 61 and 62 between t1 and t2. Since transistor 13 is enabled and supplying current 53, the Vds of transistor 13 will be no less than the value from Ref2 27 and the Vgs of transistor 13 will be greater than the threshold voltage (Vth) of transistor 13. Consequently, the output of comparator 37 will remain negated.

Because the value of ref2 27 is greater than the value of Ref1 28, transistor 13 may dissipate more power in the second operating mode, thus, controller 20 may be configured to operate in the first operating mode for a first time interval and then operate in the second operating mode for a second time interval that is less than the first time interval. In some embodiments, controller 45 may be configured to control signal 49, and optionally signal 50, to form the first and second time intervals. In some embodiments, the second time interval may be one tenth or less of the first time interval. An embodiment may include that the second time interval is between approximately two percent to approximately 15 percent (2%-15%) of the length of the first time interval. In other embodiments the time interval of the second operating mode may be greater, especially if power dissipation in transistor 13 is less of a concern.

After t2, circuit 20 returns to operating in the first operating mode as illustrated by plot 60 between time t2 and a time t4.

Assume that at a time t3, load 12 is absent. As illustrated by plot 60, load current 52 will decrease. In some embodiments, current 52 may become substantially zero. In other embodiments, there may be some leakage current such that current 52 is greater than zero. Circuit 31 is configured to control transistor 13 to supply current 53 as load current 52 in the first operating mode including the interval between times t3 and t4. Thus, transistor 13 is enabled and the Vgs of transistor 13 is greater than the threshold voltage, thus, signal 38 remains negated.

Assume that at time t4 and between t4 and a time t5, circuit 20 again is operating in the second operating mode. Transistor 42 is enabled and supplies current 54 as at least a portion of current 52. If load 12 is absent the value of current 52 may be substantially zero or if there are leakage currents, the value of current 52 may be very small as illustrated by plot 61 between t4 and time t5. Assume that in an embodiment load 12 remains absent, the value of current 53 from transistor 13 will be small as illustrated by plot 62 between t4 and time t5. Because the drain-source voltage (Vds) of transistor 13 is controlled to be no less than Ref2 27 and the value of current 53 is very small, transistor 13 operates in saturation in order to increase the on-resistance (Rdson) to maintain Vds approximately equal to Ref2 27. As a consequence, the Vgs of transistor 13 becomes less than the threshold voltage (Vth). In some embodiments, the Vgs may become substantially zero. Accordingly, the Vgs of transistor 13 comes less than the value of Ref3 36 which causes comparator 37 to assert detect signal 38. Controller 45 may receive the asserted state of detect signal 38 as an indication that load 12 is absent. Controller 45 or alternately other portions of system 10 may be configured to take other actions in response to circuit 20 detecting the absence of load 12. Thus, in one embodiment, transistor 42 is enabled to supply the leakage current to load 12 in response to the Vds of transistor 13 is not greater than a first value. For example, the first value may be the value of the signal from Ref2 27. In an embodiment, the drive signal is representative of an error signal. IF the error signal is above Vth, current 52 is above a threshold load current value and load 12 is present. IF the error signal is less than Vth, current 52 is less than the threshold load current and is presumed to be leakage current and detect signal 38 is asserted to indicate that load 12 is absent.

In one example embodiment, circuit 20 was configured to form current 52 to have a value between approximately one amp and approximately ten amps (1-10 A) in the first operating mode and to detect that load 12 was absent even in the presence of current 52 leakage currents between approximately five and approximately thirty milli-amps (5-30 ma.)

Those skilled in the art will appreciate that in an embodiment, transistor 42, switch 40, and Ref4 39 may operate as a selectable current source configured to form current 54 in response to the second operating mode. In an embodiment, switch 40 connecting Ref4 39 to the control electrode of transistor 42 assists in forming the selectable current source. An embodiment may include that the selectable current source is configured to be coupled in parallel with transistor 13. Transistor 42 may be either an N-channel or a P-channel transistor independently of whether transistor 13 is N-channel or P-channel. For example, transistor 42 may be a P-channel transistor, and ref4 39 may be configured to form a voltage that is less than the source voltage of transistor 42 (voltage from terminal 22). Alternately, transistor 42 may be an N-channel transistor, and ref4 39 may be configured to form a voltage that is greater than the source voltage of transistor 42 (greater than the voltage on terminal 23). Additionally, those skilled in the art will appreciate that transistor 13 may be a P-channel transistor with appropriate changes in the polarity of signal 33. In another embodiment, transistor 13 may be included within and may be a portion of circuit 20. In an alternate embodiment, load 12 may also be included within and may be a portion of circuit 20. In one embodiment, circuit 31, switch 29, Ref1 28, and Ref2 27 may be an alternate embodiment of circuit 74 (FIGS. 1 and 2) (and vice versa). Those skilled in the art will appreciate that amplifier 31, switch 29, and Ref2 27 are merely an example of an embodiment of a portion of the closed loop control configuration for controlling transistor 13, In other embodiments, amplifier 31, switch 29, and Ref2 27 may be replaced by other circuits that implement the function of $V_{33}=A(V_{22}-Voffset)$ with A>1, where $V_{33}$ is the voltage of drive signal 33, $V_{22}$ is the voltage received from the electrode of transistor 13 connected to terminal 22 and $V_{offset}$ is an offset voltage subtracted from $V_{22}$. Additionally, comparator 37 and Ref3 36 may be an alternate embodiment of circuit 78 (FIGS. 1 and 2) (and vice versa). Transistor 42, switch 40, and Ref4 39 may be an alternate embodiment of circuit 76 (and vice versa).

In order to facilitate the hereinbefore described functionality for circuit 20, terminal 22 is configured to be coupled to a first current carrying electrode of transistor 13 and terminal 23 is configured for connecting to a second current carrying electrode of transistor 13. Output 25 of circuit 20 is configured for coupling to a gate of transistor 13. A first current carrying electrode of transistor 42 is commonly connected to terminal 22, a first terminal of Ref2 27 27 and a first terminal of Ref1 28. A second terminal of Ref1 28 is connected to a first input (A) switch 29 and a second terminal of Ref2 27 is connected to a second terminal (B) of switch 29. An output of switch 29 is connected to a non-inverting input of circuit 31. A control terminal of switch 29 is coupled to receive signal 49 on a first output of controller 45. An inverting input of circuit 31 is commonly connected to terminal 23, a first input of Ref3 36, a first input of Ref4 39, a first input (A) of switch 40, and a second current carrying electrode of transistor 42. An output of Ref4 39 is connected to a second terminal (BV) of switch 40. An output of switch 40 is connected to a gate of transistor 42. A control terminal of switch 40 is connected to the first output of controller 45 or alternately connected to receive the second mode signal on a second output of controller 45. A first output of Ref3 36 is connected to a non-inverting input of comparator 37. An inverting input of comparator 37 is commonly connected to an output of circuit 31 and to output 25. An output of comparator 37 is coupled to an input of controller 45.

Figure 5:
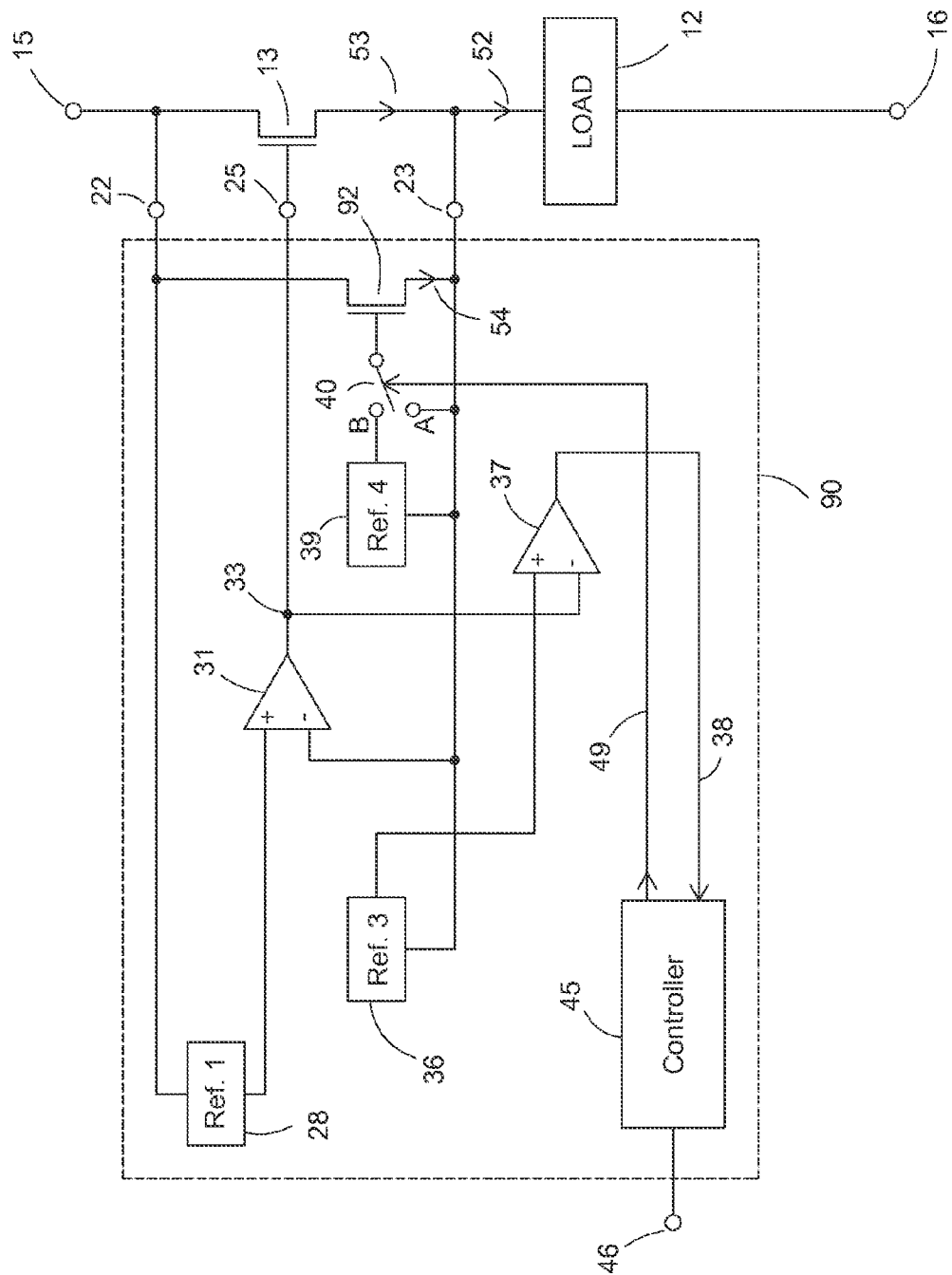
FIG. 5 schematically illustrates a portion of an example of an embodiment of a load detection circuit that is an alternate embodiment of the load detection circuit of any of FIG. 1-3 in accordance with the present invention.

FIG. 5 schematically illustrates a portion of an example of an embodiment of a load detection circuit 90 that is an alternate embodiment of circuit 20 that was described in the description of FIG. 3. Circuit 90 includes a diagnostic transistor 92 that is an alternate embodiment of transistor 42 that was explained in the description of FIG. 3. Circuit 90 is similar to circuit 20 except that transistor 92 is formed to have a size or an active area that is larger than the size or active area of transistor 42 (FIG. 3). As a result, in the second operating mode transistor 13 can be controlled to have the same Vds as in the first operating mode. Consequently, Ref2 27 and switch 29 are omitted from circuit 90. However, except for the switching of switch 29, circuit 90 operates substantially the same as circuit 20.

Figure 6:
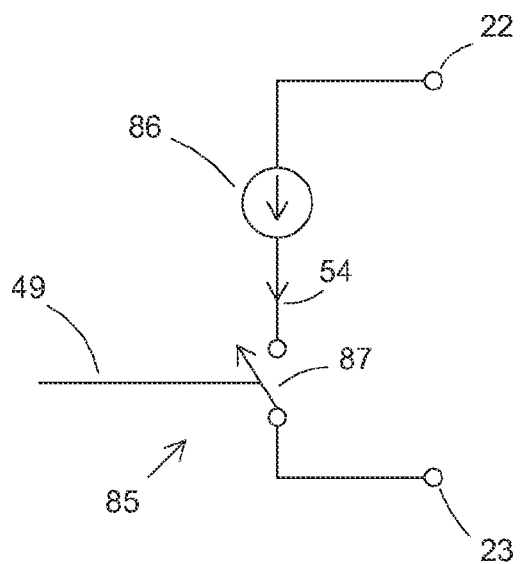
FIG. 6 schematically illustrates an example of an embodiment of a portion of a diagnostic circuit that is an alternate embodiment of at least a portion of the diagnostic circuit of any of the circuits of FIG. 1-3 and in accordance with the present invention.

FIG. 6 schematically illustrates an example of an embodiment of a portion of diagnostic circuit 85 that is an alternate embodiment of at least a portion of the diagnostic circuit of circuit 20 (FIG. 3) or any of the diagnostic circuits of FIGS. 1-3 and 5. In an alternate embodiment, transistor 42, switch 40, and Ref4 39 of circuit 20 may be replaced with a selectable current source that selectively supplies current 54 in response to the second operating mode. For example, a current source 86 may be configured to supply current 54 in response to the second operating mode. An embodiment of circuit 85 may include a switch 87 that is configured to selectively apply current 54 to terminal 23 in response to the second operating mode. For example, in response to first mode control signal 49 or alternately in response to second mode control signal 50. In an embodiment, circuit 85 may supply current 54 as at least a portion of load current 52 in response to the second operating mode. Although a terminal of source 86 is illustrated as being connected to terminal 22, the first terminal of source 86 may be connected to a different source of power in other embodiments.

Figure 7:
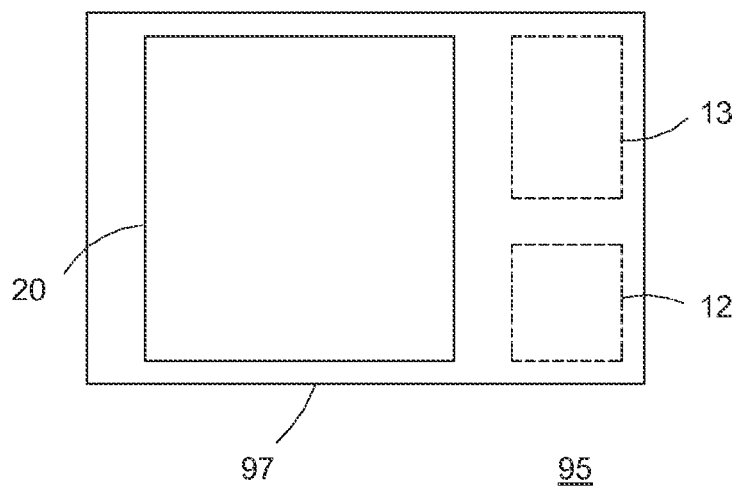
FIG. 7 illustrates an enlarged plan view of a semiconductor device that includes the load detection circuit of any of FIGS. 1-3 and 5-6 in accordance with the present invention.

FIG. 7 illustrates an enlarged plan view of a portion of an embodiment of a semiconductor device or integrated circuit 95 that is formed on a semiconductor die 97. Circuit 20 or alternately circuit 66, 72, or 90 may be formed on die 97. In some embodiments, transistor 13 and/or load 12 may also be formed on die 97 as illustrated by dashed lines. Die 97 may also include other circuits that are not shown in FIG. 5 for simplicity of the drawing. Circuit 20 and device or integrated circuit 95 are formed on die 97 by semiconductor manufacturing techniques that are well known to those skilled in the art.

In one embodiment, a control circuit for a switch (such as a FET switch for example), such as for example an under-load detection circuit, may be configured to detect the under-load condition or absence of load 12 by periodical activation of a smaller FET or under-load FET, such as for example transistor 42, in parallel to a power FET, such as for example transistor 13. In one example embodiment, a two phase method may be used to detect the absence of load 12. For example, for a phase 1, the gate of the power FET is driven with a gate regulation amplifier to form a voltage between the Power FET terminals that is not lower than a Drive Phase reference voltage. This Drive Phase reference voltage can be larger than or equal to zero. The under-load FET is disabled in this phase and does not intervene in the gate regulation, the power FET current is equal to the load current.

In one example embodiment of a method for phase 2, the gate of the power FET may be driven with the gate regulation amplifier to create a voltage between the FET terminals that is not lower than the Under-load Phase reference voltage. At the same time, the under-load FET is activated by switching its gate to an appropriate power rail. The under-load FET delivers a current to the load impedance that is equal to the Under-load Phase reference voltage divided by its Ron, the under-load current. If the current through the load is larger than approximately the under-load current, the gate regulation amplifier may drive the gate of the Power FET to the voltage needed to drive the remaining current. If the current through the load is larger than approximately zero, the Power FET gate voltage will be approximately above the characteristic threshold voltage of the Power FET. If the current through the load is approximately zero (remaining load current is supplied thru the under-load FET), the gate voltage on the Power FET may be regulated to its source voltage to disable it. An under-load detection comparator monitors the Power FET gate voltage and sets the under-load signal in response to the gate voltage drops below the threshold voltage.

An example of a method to detect that the current through a power FET is above or below a threshold or near a threshold value may include, for example detect current is below or above a threshold current; by regulation of the resistive drop over the power FET to a defined minimum voltage, or for example by activation of a parallel device (current source or under-load FET) that provides the threshold current to the load if the drop over the Power FET is approximately equal to a minimum voltage, or for example by evaluation of an error signal of the regulation loop (Power FET gate voltage) to discriminate between two conditions, such as for example load current approximately below or approximately above a threshold current.

One advantage of this technique may include that the detection threshold may only be determined by the Under-load Phase reference voltage and the Ron of the under-load detection FET. The choice of the parameters allows tuning of the threshold independent of the size of the Power FET and its minimum and maximum load impedances. Another advantage may include that the inaccuracy contributor to detection threshold is the Ron of the under-load detection FET. The under-load phase reference voltage can be designed with good accuracy. To minimize the inaccuracies caused by the Ron variation, the Under-load FET could be substituted with a switched constant current source. Another advantage may include that the circuits to drive and observe the signals can all be simple circuits that don't need high accuracy (advantage versus measuring the voltage between the FET power rail and load terminal). It is not required to integrate a current mirror inside the power FET (advantage versus copying the FET current with a current mirror).

From all the foregoing one skilled in the art can determinate that according to one embodiment, a method of forming a load detection circuit may include:

configuring a first switch (such as for example transistor 13) to supply a load current to a load; configuring a second switch (for example transistor 42) for selectively coupling in parallel to the first switch;

configuring a first circuit (such as the circuit that includes circuit 31) to operate in a first mode to selectively disable the second switch and to control the first switch to have a voltage across the first switch that is substantially equal a first value;

configuring the first circuit to operate in a second mode to selectively enable the second switch and to control the first switch to have a voltage across the first switch that is substantially equal to a second value; and configuring a detect circuit (for example circuit comparator 37) to detect a drive signal (for example signal 33) of the first circuit having a third value that is substantially less than a threshold voltage of the first switch.

According to another embodiment, the method may include forming the second value larger than the first value.

Another embodiment may include coupling a third switch to a control electrode of the second switch to enable the second switch.

Another embodiment may include forming the third value to be representative of the threshold value of the first switch.

From all the foregoing, those skilled in the art will understand an embodiment of a load detection circuit may comprise; a driver circuit, such as for example circuits 31 or 74, configured to form a drive signal, such as for example signals 33 or 75, to drive a control electrode of a drive transistor, such as for example transistor 13, with a first control signal, such as for example the control signal formed by signals 33 or 75 on terminal 25, to form a voltage between a first current carrying electrode of the drive transistor and a second current carrying electrode, such as for example between the source and drain of transistor 13, of the drive transistor;

a first switch, such as for example switch 29, coupled to selectively couple a first signal, such as for example the signal from Ref1 28, to the driver circuit responsively to a first state of a mode signal, such as for example a first state of signal 49, and to selective couple a second signal, such as for example the signal from Ref2 27, to the driver circuit responsively to a second state of the mode signal wherein the driver circuit is configured to form the voltage to have a first value, such as for example the value from Ref1 28, responsively to receiving the first signal and to form the voltage to have a second value, such as for example the value from Ref2 27 or greater, responsively to receiving the second signal;

a diagnostic transistor, such as for example transistor 42, configured to be coupled in parallel with the drive transistor, the diagnostic transistor having a control electrode configured to receive a second control signal, the second control signal having a third value, such as for example the value of the source of transistor 42, responsively to the first state of the mode signal and having a fourth value, such as for example the value from Ref4 39, responsively to the second state of the mode signal, wherein the third value substantially disables the diagnostic transistor; and a comparator configured to detect the control electrode of the drive transistor having a fifth value, such as for example the value from Ref3 36, that is less than a threshold voltage of the drive transistor in response to the second state of the mode signal.

Another embodiment may include that the driver circuit may be configured to form the drive signal to enable the drive transistor in response to receiving the first signal and in response to receiving the second signal.

In another embodiment, the drive transistor and the driver circuit may be configured to form a closed control loop for the second state of the mode signal.

An embodiment may include that the comparator may have a first input coupled to receive the first control signal and a second input coupled to receive a reference signal, the reference signal having a sixth value that is representative of no greater than the threshold voltage of the drive transistor.

In an embodiment, the driver circuit may have a first input coupled to receive a signal on the first current carrying electrode of the drive transistor, a second input coupled to the first switch to receive the first and second signals, and an output coupled to the control electrode of the drive transistor.

An embodiment may include that the diagnostic transistor has the control electrode coupled to receive the second control signal from a second switch, the second switch configured to couple the control electrode of the diagnostic transistor to a first current carrying electrode of the diagnostic transistor responsively to the first state of the mode signal and to couple the control electrode of the diagnostic transistor to receive the fourth value from a reference circuit responsively to the second state of the mode signal.

An embodiment may also include a control circuit configured to form the first and second state of the mode signal wherein the first state of the mode signal has a longer time interval than the second state of the mode signal.

Another embodiment may include that the drive transistor may be an N-channel MOS transistor and the diagnostic transistor is one of an N-channel transistor or a P-channel MOS transistor.

In an embodiment, a first current carrying electrode, such as for example the source, of the diagnostic transistor may be configured for coupling to the first current carrying electrode, such as for example the source, of the drive transistor, a second current carrying electrode of the diagnostic transistor may be configured for coupling to the second current carrying electrode of the drive transistor, and the control electrode of the diagnostic transistor is not coupled to the control electrode of the drive transistor.

Those skilled in the art will appreciate that a method of forming a load detection circuit may comprise providing a current source, such as for example current source 85;

configuring the load detection circuit to operate in a first mode and selectively disable the current source and selectively apply a first control signal having a first value, such as for example the value from Ref1 28, to a first transistor, such as for example transistor 13, to control the first transistor to form a load current to a load;

configuring the load detection circuit to operate in a second mode and selectively enable the current source to form at least a portion, such as for example current 54, of the load current to the load and to selectively apply a second control signal having a second value, such as for example the value from Ref2 27, to the first transistor to control the first transistor and form a first voltage across the first transistor wherein the first voltage is no less than the second value; and configuring a detect circuit, such as for example circuits 37 or 78, to detect the second control signal having the second value that is substantially less than a threshold voltage of the first transistor.

Another embodiment of the method may include configuring the detect circuit to operate in the second mode to detect the second control signal having the second value that is substantially less than the threshold voltage.

In an embodiment, the method may also include coupling a first current carrying electrode, such as for example a source, of a second transistor to a terminal that is configured for coupling to a first current carrying electrode of the first transistor, and coupling a second current carrying electrode, such as for example a drain, of the second transistor to a terminal that is configured for coupling to a second current carrying electrode (drain, of the first transistor.

Another embodiment may include configuring the first transistor and a driver circuit, such as for example circuits 31 or 74, to operate in a closed loop configuration to control the first transistor and form the first voltage across the first transistor, such as for example across the source-to-drain voltage.

An embodiment may include configuring the load detection circuit to control the first transistor to form another portion of the load current.

In an embodiment, the method may also include configuring the load detection circuit to selectively apply the second control signal to the first transistor wherein the second control signal has substantially the first value.

Those skilled in the art will also appreciate that an embodiment of a load detection circuit may comprise:

a first circuit, such as for example circuit 31 or 74, configured to control a first transistor, such as for example transistor 13, to form a load current, such as for example current 52, to a load in a first operating mode of the load detection circuit;

a second circuit, such as for example circuit 67 or 85, configured to selectively form a portion, such as for example current 54, of the load current in response to a second operating mode of the load detection circuit but not in the first operating mode;

the first circuit may be configured to control the first transistor in a closed loop configuration to form a voltage drop across the first transistor, such as for example the Vds, in the second operating mode; and a detection circuit configured to detect the load current is less than a threshold value of the load current.

Another embodiment may include that the first circuit includes an amplifier configured to selectively apply a first signal having a first value to a control electrode of the first transistor in response to the first operating mode, and to apply a second signal having a second value to the control electrode of the first transistor in response to the second operating mode.

In an embodiment, the first value may be less than the second value.

Another embodiment may include that the second circuit includes a selectable current source, such as for example source 85, having a second transistor, such as for example transistor 42, and a third circuit, such as for example circuits 39 and 40, configured to control the second transistor to supply the portion of the load current wherein the third circuit may be configured to couple a control electrode of the second transistor to a first control signal, such as for example to the source of transistor 42, having a first value that is less than a threshold value of the second transistor in response to the first operating mode, and to couple the control electrode of the second transistor to a second control signal, such as for example the signal from Ref4 39, having a second value that is greater than the threshold value of the second transistor.

In an embodiment, the detection circuit may include a comparator having a first input coupled to a control electrode of the first transistor and a second input coupled to receive a reference signal having a reference value that is less than the threshold value of the first transistor.

In view of all of the above, it is evident that a novel device and method is disclosed. Included, among other features, is forming a load detection circuit to operate in a diagnostic mode and control a transistor in a closed loop operating mode to form a first on-resistance, and to control a second transistor to form a portion of a load current to the load such that the first transistor forms a drive signal that facilitates detection the absence of the load. The circuit facilitates detecting that the load is absent even if there is some leakage current flowing to the load. Those skilled in the art will appreciate that the value of the signal from Ref2 27 can be accurately controlled and is more accurate that other methods to detect that the load is absent.

While the subject matter of the descriptions are described with specific preferred embodiments and example embodiments, the foregoing drawings and descriptions thereof depict only typical and examples of embodiments of the subject matter and are not therefore to be considered to be limiting of its scope, it is evident that many alternatives and variations will be apparent to those skilled in the art. As will be appreciated by those skilled in the art, the example form of circuit 20 is used as a vehicle to explain the operation method of detecting the absence of the load, but other embodiments are feasible. For example, in an embodiment, any one of circuits 66, 72, 20, or 90 may be configured to operate transistor 13 in an open loop configuration in the first operating mode. For example the driver circuit of the corresponding one of circuits 66, 72, 20, or 90 may be configured to operate transistor 13 in the open loop configuration in the first operating mode. An embodiment may include that during at least a portion of the first time interval, transistor 13 may be fully enabled. For example, transistor 13 may be fully enabled in response to a digital control signal having a first value to enable and a second value to disable transistor 13. An embodiment may include that any one of circuits 66, 72, 20, or 90 may be configured to operate transistor 13 in a closed loop configuration in the first operating mode. In an embodiment, the value of the voltage from Ref1 28 may be approximately zero volts in response to operating transistor 13 in a closed loop configuration, such as for example when operating in the first operating mode. Those skilled in the art will appreciate that controllers 20, 65, and/or 70 may have various embodiments that control transistor 13 in different ways in the first operating mode including controlling transistor 13 in an open loop configuration or a closed loop configuration and/or with a variety of set points for the gate voltage applied to transistor 13.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A load detection circuit comprising:
   a driver circuit configured to form a drive signal to drive a control electrode of a drive transistor with a first control signal to form a voltage between a first current carrying electrode of the drive transistor and a second current carrying electrode of the drive transistor;
   a first switch coupled to selectively couple a first signal to the driver circuit responsively to a first state of a mode signal and to selective couple a second signal to the driver circuit responsively to a second state of the mode signal wherein the driver circuit is configured to form the voltage to have a first value responsively to receiving the first signal and to form the voltage to have a second value responsively to receiving the second signal;
   a diagnostic transistor configured to be coupled in parallel with the drive transistor, the diagnostic transistor having a control electrode configured to receive a second control signal, the second control signal having a third value responsively to the first state of the mode signal and having a fourth value responsively to the second state of the mode signal, wherein the third value substantially disables the diagnostic transistor; and
   a comparator configured to detect the control electrode of the drive transistor having a fifth value that is less than a threshold voltage of the drive transistor in response to the second state of the mode signal.

2. The load detection circuit of claim 1 wherein the driver circuit is configured to form the drive signal to enable the drive transistor in response to receiving the first signal and in response to receiving the second signal.

3. The load detection circuit of claim 1 wherein the drive transistor and the driver circuit form a closed control loop for the second state of the mode signal.

4. The load detection circuit of claim 1 wherein the comparator has a first input coupled to receive the first control signal and a second input coupled to receive a reference signal, the reference signal having a sixth value that is representative of no greater than the threshold voltage of the drive transistor.

5. The load detection circuit of claim 1 wherein the driver circuit has a first input coupled to receive a signal on the first current carrying electrode of the drive transistor, a second input coupled to the first switch to receive the first and second signals, and an output coupled to the control electrode of the drive transistor.

6. The load detection circuit of claim 1 wherein the diagnostic transistor has the control electrode coupled to receive the second control signal from a second switch, the second switch configured to couple the control electrode of the diagnostic transistor to a first current carrying electrode of the diagnostic transistor responsively to the first state of the mode signal and to couple the control electrode of the diagnostic transistor to receive the fourth value from a reference circuit responsively to the second state of the mode signal.

7. The load detection circuit of claim 1 further including a control circuit configured to form the first and second state of the mode signal wherein the first state of the mode signal has a longer time interval than the second state of the mode signal.

8. The load detection circuit of claim 1 wherein the drive transistor is an N-channel MOS transistor and the diagnostic transistor is one of an N-channel transistor or a P-channel MOS transistor.

9. The load detection circuit of claim 1 wherein a first current carrying electrode of the diagnostic transistor is configured for coupling to the first current carrying electrode of the drive transistor, a second current carrying electrode of the diagnostic transistor is configured for coupling to the second current carrying electrode of the drive transistor, and the control electrode of the diagnostic transistor is not coupled to the control electrode of the drive transistor.

10. A method of forming a load detection circuit comprising:
    providing a current source;
    configuring the load detection circuit to operate in a first mode and selectively disable the current source and selectively apply a first control signal having a first value to a first transistor to control the first transistor to form a load current to a load;
    configuring the load detection circuit to operate in a second mode and selectively enable the current source to form at least a portion of the load current to the load and to selectively apply a second control signal having a second value to the first transistor to control the first transistor and form a first voltage across the first transistor wherein the first voltage is no less than the second value; and
    configuring a detect circuit to detect the second control signal having the second value that is substantially less than a threshold voltage of the first transistor.

11. The method of claim 10 wherein configuring the detect circuit to detect the second control signal includes configuring the detect circuit to operate in the second mode to detect the second control signal having the second value that is substantially less than the threshold voltage.

12. The method of claim 10 wherein configuring the current source for coupling in parallel to the first transistor includes coupling a first current carrying electrode of a second transistor to a terminal that is configured for coupling to a first current carrying electrode of the first transistor, and coupling a second current carrying electrode of the second transistor to a terminal that is configured for coupling to a second current carrying electrode of the first transistor.

13. The method of claim 10 wherein configuring the load detection circuit to operate in the second mode includes configuring the first transistor and a driver circuit to operate in a closed loop configuration to control the first transistor and form the first voltage across the first transistor.

14. The method of claim 10 wherein configuring the load detection circuit to operate in the second mode includes configuring the load detection circuit to control the first transistor to form another portion of the load current.

15. The method of claim 10 wherein configuring the load detection circuit to operate in the second mode includes configuring the load detection circuit to selectively apply the second control signal to the first transistor wherein the second control signal has substantially the first value.

16. A load detection circuit comprising:
   a first circuit configured to control a first transistor to form a load current to a load in a first operating mode of the load detection circuit;
   a second circuit configured to selectively form a portion of the load current in response to a second operating mode of the load detection circuit but not in the first operating mode;
   the first circuit configured to control the first transistor in a closed loop configuration to form a voltage drop across the first transistor in the second operating mode; and
   a detection circuit configured to detect the load current is less than a threshold value of the load current.

17. The load detection circuit of claim 16 wherein the first circuit includes an amplifier configured to selectively apply a first signal having a first value to a control electrode of the first transistor in response to the first operating mode, and to apply a second signal having a second value to the control electrode of the first transistor in response to the second operating mode.

18. The load detection circuit of claim 17 wherein the first value is less than the second value.

19. The load detection circuit of claim 16 wherein the second circuit includes a selectable current source having a second transistor and a third circuit configured to control the second transistor to supply the portion of the load current wherein the third circuit is configured to couple a control electrode of the second transistor to a first control signal having a first value that is less than a threshold value of the second transistor in response to the first operating mode, and to couple the control electrode of the second transistor to a second control signal having a second value that is greater than the threshold value of the second transistor.

20. The load detection circuit of claim 16 wherein the detection circuit includes a comparator having a first input coupled to a control electrode of the first transistor and a second input coupled to receive a reference signal having a reference value that is less than the threshold value of the first transistor.

* * * * *